(12) United States Patent
Geerke et al.

(10) Patent No.: US 7,969,550 B2
(45) Date of Patent: Jun. 28, 2011

(54) LITHOGRAPHIC APPARATUS AND DEVICE MANUFACTURING METHOD

(75) Inventors: Johan Hendrik Geerke, Eindhoven (NL); Peter Paul Hempenius, Nuenen (NL); Youssef Karel Maria De Vos, Lille (BE); Clementius Andreas Johannes Beijers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 406 days.

(21) Appl. No.: 11/785,751

(22) Filed: Apr. 19, 2007

(65) Prior Publication Data

US 2008/0259299 A1    Oct. 23, 2008

(51) Int. Cl.
*G03B 27/32* (2006.01)
*G03B 27/42* (2006.01)
*G03B 27/52* (2006.01)

(52) U.S. Cl. .............................. 355/53; 355/75; 355/77
(58) Field of Classification Search .................. 355/52, 355/53, 55, 77, 30, 67, 71, 72, 75; 181/205–209, 181/284–285, 290, 198, 200; 310/12.01, 310/12.04–12.06; 318/649
See application file for complete search history.

(56) References Cited

U.S. PATENT DOCUMENTS

| | | | | |
|---|---|---|---|---|
| 4,226,299 A  * | 10/1980 | Hansen | .......................... | 181/284 |
| 6,450,288 B1 * | 9/2002 | Akiyama et al. | .............. | 181/200 |
| 6,757,048 B2 * | 6/2004 | Arakawa | .......................... | 355/30 |
| 7,492,441 B2 * | 2/2009 | Van Empel | ..................... | 355/53 |
| 2004/0017167 A1* | 1/2004 | Nishi | ............................. | 318/114 |
| 2005/0012912 A1* | 1/2005 | Draaijer et al. | .................. | 355/52 |
| 2005/0052633 A1* | 3/2005 | Mori et al. | ...................... | 355/53 |
| 2005/0168712 A1 * | 8/2005 | Miyajima | ....................... | 355/30 |
| 2009/0195760 A1* | 8/2009 | Hempenius et al. | ............ | 355/18 |

* cited by examiner

*Primary Examiner* — Hung Henry Nguyen
*Assistant Examiner* — Colin Kreutzer
(74) *Attorney, Agent, or Firm* — Sterne, Kessler, Goldstein & Fox P.L.L.C.

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a shield device arranged between a source of air flows and/or pressure waves and an element sensitive for the air flows and/or pressure waves.

26 Claims, 2 Drawing Sheets

LITHOGRAPHIC APPARATUS AND DEVICE MANUFACTURING METHOD

BACKGROUND

1. Field

The present invention relates to a lithographic apparatus, a method for shielding an element of a lithographic apparatus for air flows and pressure waves and a device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic process of a lithographic apparatus, it is desirable that at least the patterning device, the projection system and the substrate stage be properly aligned with respect to one another so that the pattern, which is provided by the patterning device in the radiation beam, is properly projected on a target portion of the substrate without overlay errors, imaging errors or focus errors. In particular, in scanners, in which the patterning device support (e.g. reticle stage) and the substrate table (e.g. substrate stage) are movable to position a particular part of the pattern with respect to a particular part of the substrate, high accuracy positioning is desirable. For these movements, positioning systems are provided which control the position of the reticle stage and substrate stage with high accuracy.

With continuously increasing demands on the accuracy of imaging, for instance overlay and focus on the one hand and throughput on the other, proper alignment of the reticle stage, projection system and substrate table becomes increasingly critical. In order to increase the throughput of the lithographic apparatus, it is desirable to increase the speed and acceleration with which the reticle stage and substrate stage are moved and aligned with respect to each other and the projection system.

However, moving the reticle stage or the substrate stage results in air flows and pressure waves which propagate through the space in which these stages but also the projection system are present. Also, the actuation forces of the stage may cause vibrations of parts of the stage resulting in air flows and/or pressure waves, such as acoustic signals or air flows through the working space. These air flows and/or pressure waves may excite the projection system, or at least parts of the projection system such as the lenses, or the frame on which the projection system is mounted. The air flows and/or pressure waves may also excite other parts of the lithographic apparatus being relevant for the alignment of the reticle stage projection system and wafer stage such as sensor or sensor target object of a stage position measurement system. The excitation of the projection system, or the other parts, may cause imaging errors such as errors in overlay and/or focus.

Also, other moving or vibrating parts in the lithographic apparatus may provide air flows and/or pressure waves in the process area, in particular in the environment of the projection system resulting in excitation of the projection system or the other parts. Also, the air flows and/or pressure waves resulting from these movements may result in imaging errors such as overlay and/or focus errors.

SUMMARY

It is desirable to provide a lithographic apparatus wherein imaging errors due to air flows and pressure waves in the process area are substantially reduced.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a shield device arranged between a source of air flows and/or pressure waves and an element sensitive to the air flows and/or pressure waves.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a shield device arranged between the projection system and the support or the substrate table.

According to an embodiment of the invention, there is provided a method of shielding a lithographic apparatus element sensitive to air flows and/or pressure waves in the environment of the element, by providing a shield device between the element and a source of air flows and/or pressure waves.

In an embodiment of the invention, there is provided a device manufacturing method including projecting a patterned beam of radiation onto a target portion of a substrate with a lithographic apparatus; and during the projecting, shielding an element of the lithographic apparatus sensitive to air flow and/or pressure wave from and a source of air flow and/or pressure wave.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
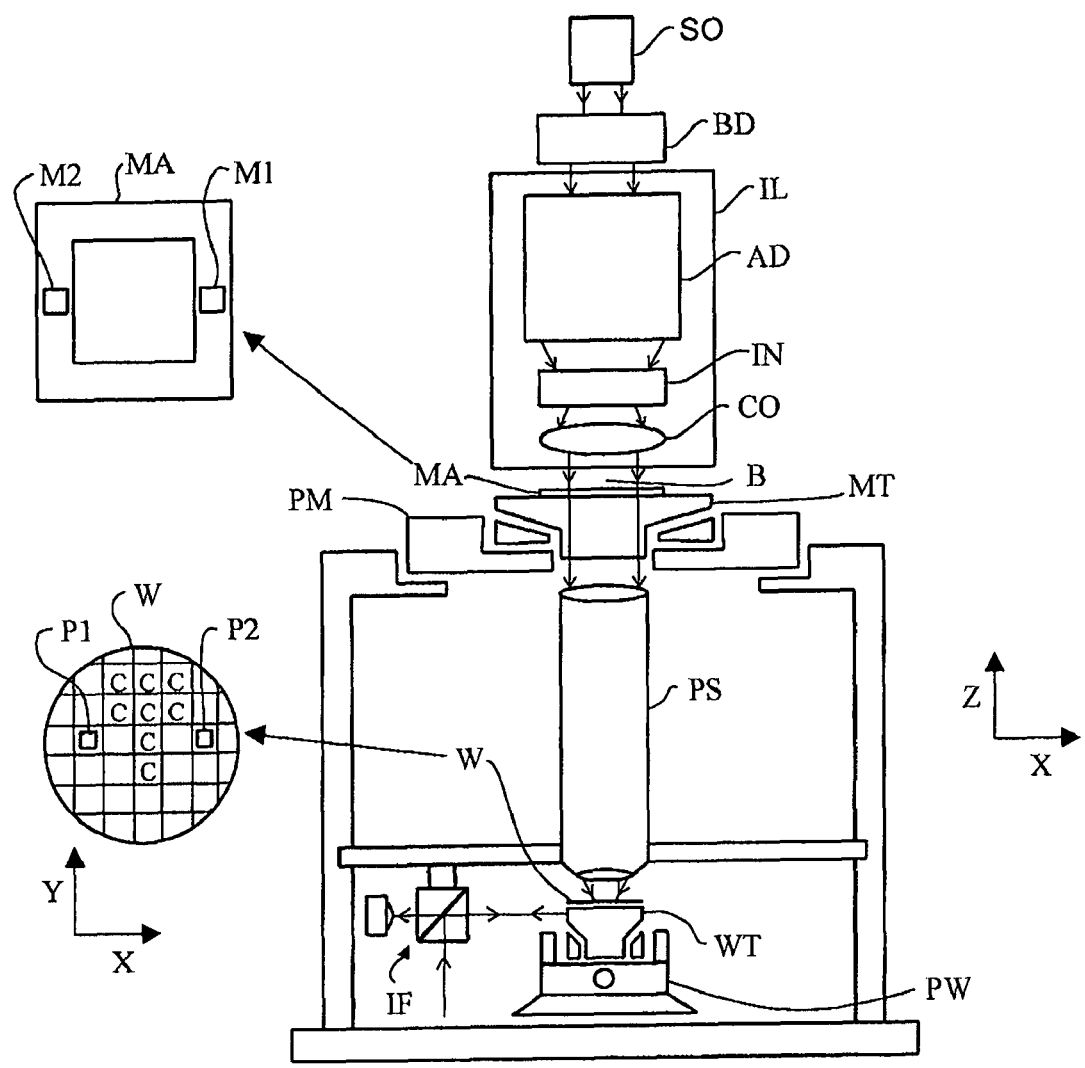
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or pattern support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure (e.g. mask table) supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device of mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure or pattern support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure or pattern support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure or pattern support (e.g. mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
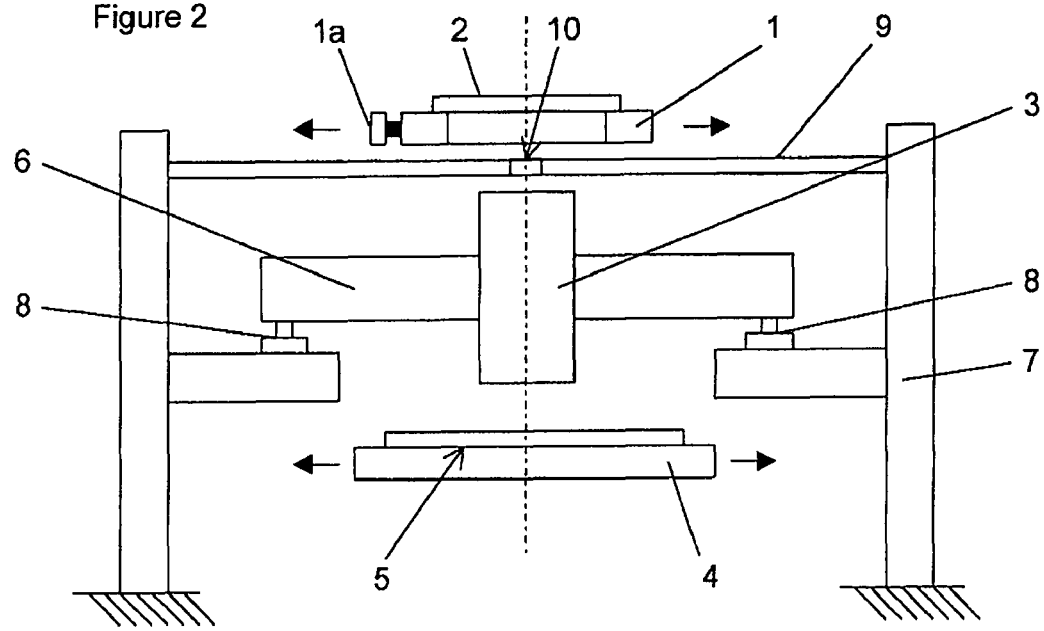
FIG. 2 depicts an air flow or pressure wave shield device in accordance with an embodiment of the invention.

FIG. 2 depicts a part of the lithographic apparatus of FIG. 1. The support structure (e.g. reticle stage) 1 supports a patterning device (e.g. a reticle) 2. The reticle stage 1 is located above a projection system 3. Under the projection system 3, a substrate stage 4 configured to carry a substrate 5 is positioned. The reticle stage 1 and the substrate stage 4 are movable with high accuracy so that during projection the reticle stage 1 and substrate stage 4 can be moved with a scanning movement with respect to the projection system 3 to project a projection beam having a pattern imparted by the reticle 2 on a target portion of the substrate 5 supported by the substrate stage 4.

The projection system 3 is supported by a so-called metrology frame or metro-frame 6 which is a substantially stationary frame. The metro-frame 6 is mounted on a base frame 7 by a number of air mounts 8. These air mounts 8 may include active or passive damping devices so that any vibrations in the base frame 7 are not passed onto the metro-frame 6. In this way, the projection system 3 is substantially isolated from vibrations in the base frame 7 in order to decrease imaging errors such as overlay or focus errors in the projection of the patterned beam on the substrate 5 due to vibration/movement of the projection system 3.

However, the movement of the reticle stage 1 may cause air flows and pressure waves, around the reticle stage 1 and, as a result, in the process area, i.e. the area in which the reticle stage 1, the projection system 3 and the substrate stage 4 are arranged.

Furthermore, the reticle stage 1 may include one or more parts 1a which may be mounted with some flexibility to the reticle stage main body. As a result of the movements of the reticle stage, such part 1a may also move with respect to the reticle main body. This part 1a will typically have a vibrating or oscillating movement on the resonance frequency of the part 1a. Also, these movements of one or more parts 1a may result in air flows and/or pressure waves in the process area.

Some of the air flows and/or pressure waves resulting from the movement of the reticle stage 1 or any parts 1a mounted on the reticle stage 1 will propagate in the direction of the projection system 3 or the metro-frame 6 supporting the projection system 3.

In a conventional lithographic apparatus, the projection system 3 or metro-frame 6 may be excited by these air flows and/or pressure waves, which may result in movements of the projection system, in particular the lenses and/or other optical elements in the projection system 3. These movements may influence the radiation beam passing through the projection system 3 resulting in overlay and/or focus errors. It will be clear that this is undesirable.

In this respect it is remarked that in embodiments of the present application such parts, i.e. projection system and metro-frame are regarded to be sensitive to air flows and/or pressure waves. In this application, in particular parts of the lithographic apparatus which when exposed to air flows and/or pressure waves are influenced such that the accuracy of projection, e.g. overlay and/or focus, of the lithographic apparatus is decreased, are regarded to be sensitive to air flows and/or pressure waves. Such parts may, for instance, include sensors or sensor target objects, such as an interferometer or encoder grating or grid, of a stage position measurement system.

In the lithographic apparatus of FIG. 2, a shield device is provided in the form of a shield plate 9, which is arranged between the reticle stage 1 on the one hand and the projection system 3 and metro-frame 6 on the other hand. The shield plate 9 is preferably a relatively stiff and heavy plate configured to substantially absorb or reflect the air flows and/or pressure waves, and is preferably mounted on the base frame 7 so that resulting reaction forces are led to a less critical part of the lithographic apparatus. When desired, the shield plate 9 may be flexibly supported in order to isolate the shield plate 9 structurally from the base frame 7 in order to avoid generation of air flows and/or pressure waves by the shield plate 9 itself. By providing a shield plate 9, all air flows and/or pressure waves running in the direction of the projection system 3 or metro-frame 6 will at least for a large extent be absorbed or reflected by the shield plate 9 and thus not reach the projection system 3 or metro-frame 6. As a result, the projection system 3 and/or metro-frame 6 are not excited by the air flows and/or pressure waves and the accuracy of projection will not be negatively influenced by the presence of the air flows and/or pressure waves caused by the movement of the reticle stage 1.

The shield plate 9 preferably extends between the whole area in which the reticle stage 1 can be moved, at least during the exposure phase, and the location of the projection system 3 and preferably also the metro-frame 6 in the case the metro-frame is sensitive to the air flows and/or pressure waves. At the location where the projection beam crosses the shield plate 9, a hole 10 is provided in the shield plate 9 in order for the patterned beam of radiation to pass through the shield plate 9. As such, hole 10 generally is undesirable since the hole may allow air flows and/or pressure waves to pass there through. Thus, in an embodiment, the hole 10 is preferably as small as possible.

In an alternative embodiment, the shield plate 9 is at least at the location where the beam of radiation passes the shield plate 9 made from a material which allows the passing of the projection beam. In this way, the provision of a hole in the shield plate 9 is avoided which is desirable as the presence of a hole may substantially decrease the extent in which the air flows and/or pressure waves are absorbed or reflected by the shield plate. However, the passing of the beam of radiation through the material of the shield plate 9 may have a negative influence on the quality of the projection beam and may for that reason be undesirable.

In an embodiment, the thickness of the shield plate 9 is preferably between values X and Y, or at least 2 times Y, whereby the values of X and Y depend on the material and frequency range of the air flows and/or pressure waves. For instance for a shield plate of aluminum or stainless steel and a frequency range of 0 to 1000 Hz, the thickness of the shield plate 9 is preferably between 5 mm and 15 mm, more preferably 8 mm and 12 mm, or at least 24 mm, more preferably at least 30 mm. Such thickness of the shield plate 9 provides a suitable absorption and/or reflection of the air flows and/or pressure waves caused by the movements of the reticle stage 1.

The stiffness of the shield plate which is needed to absorb and/or reflect the air flows and/or pressure waves may be achieved by the material itself but also by the design of the shield plate, for instance by the provision of a number of suitable ribs on the shield plate.

Instead of using a single plate as a shield device, a number of plates may be used on top of each other, preferably with a gap between two adjacent plates. This gap may be filled with air or another gas or be filled with an (acoustic) damping material. Such construction may provide an improved damping of the air flows and/or pressure waves.

Figure 3:
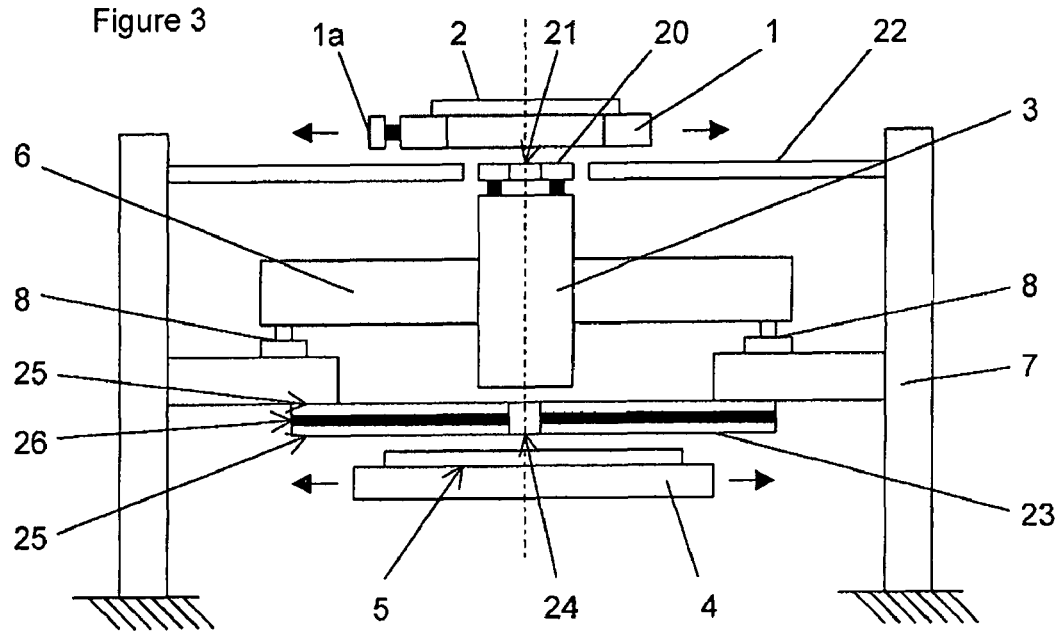
FIG. 3 depicts an air flow or pressure wave shield device in accordance with an embodiment of the invention.

FIG. 3 shows an alternative embodiment of a shield device. The shield device includes a shield plate 20 mounted on the projection system 3. The shield plate 20 includes a hole 21 for passing the patterned beam of radiation. Furthermore, the shield device includes a shield plate 22 corresponding to the shield plate 9 of FIG. 2, but having an opening in which the shield plate 20 is tightly placed. For instance, the shield plate 20 may be circular, and the hole in the shield plate 22 may also be circular having a diameter substantially corresponding to the diameter of the shield plate 20.

The shield plate 22 is rigidly mounted on the base frame 7. All reaction forces of the shield plate 22 to absorb and/or reflect the air flows and/or pressure waves are guided to the base frame in accordance with the embodiment of FIG. 2. The shield plate 20 however is mounted on the projection system itself. It is undesirable that the forces of the air flows and/or pressure waves exerted on the shield plate 20 are passed onto the projection system 3. Therefore the mounting of the shield plate 22 on the projection system has been given some flexibility, for instance by providing spring elements between shield plate 22 and projection system 3.

In general the embodiment of FIG. 3 wherein the shield device is subdivided in two parts may be undesirable as this arrangement includes a gap between shield plate 20 and shield plate 22 which may function as a leak for air flows and/or pressure waves. However, in some constructions it may not be possible to provide a (single) closed shield plate, and in those constructions the provision of two shield plates in substantially the same plane as the shield plates 20 and 22 in the embodiment of FIG. 3 may provide a suitable solution.

Furthermore, in FIG. 3, a further shield plate 23 is provided between the substrate stage 4 and the projection system 3. Similar to the movements of the reticle stage 1 the movement of the substrate stage 4 during the expose phase may result in air flows and/or pressure waves propagating through the working space. As these air flows and/or pressure waves may also excite the projection system 3 and/or the metro-frame 6, it may be advantageous to provide a shield plate 23, or other shield device between the substrate stage 4 and the projection system 3/metro-frame 6.

Also, shield plate 23 is provided with a hole 24 in order to allow the projected beam of radiation to pass through the shield plate 23. The shield plate 23 is assembled out of two plates 25 between which a damping material 26 is provided. In an alternative embodiment, the damping material may be omitted, and air or another gas may be present between the two plates 25. In another alternative embodiment, three or more parallel plates may be provided as the shield device.

The shield plate or shield device may also be designed for other functions such as, for instance, shielding of magnetic or electrical fields, or as a heat reflection, resistant or absorption shield.

Furthermore, a pressure wave shield device may be placed between any pressure wave source, such as moving and vibrating parts of the lithographic apparatus, and an element sensitive to the air flows and/or pressure waves, such as projection system parts or parts of the positioning system. Such embodiments are deemed to fall within the scope of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support constructed to support a patterning device, the patterning device capable of imparting the radiation beam with a pattern in its cross-section to form a patterned radiation beam;
    a substrate table constructed to hold a substrate;
    a projection system configured to project the patterned radiation beam onto a target portion of the substrate;
    a base frame with a metrology frame mounted thereon, wherein the metrology frame is arranged to support the projection system; and
    a shield device arranged between a source of a pressure wave and an element of the lithographic apparatus sensitive to the pressure wave, wherein the source of the pressure wave comprises a moving object of the lithographic apparatus, and wherein the shield device is arranged to substantially absorb or reflect the pressure wave and the shield device comprises two or more adjacent plates separated by one or more gaps filled with one of an air, a gas, or an acoustic damping material.

2. The lithographic apparatus of claim 1, wherein a movement of the element caused by the pressure wave causes an imaging error, wherein the imaging error comprises at least one of one or more of an overlay error and a focus error during projection of the patterned radiation beam onto the substrate.

3. The lithographic apparatus of claim 1, wherein the element comprises a part of the projection system.

4. The lithographic apparatus of claim 1, wherein the element comprises one or more lens elements of the projection system.

5. The lithographic apparatus of claim 1, wherein the element is the projection system.

6. The lithographic apparatus of claim 1, wherein the element comprises the metrology frame.

7. The lithographic apparatus of claim 1, wherein the element comprises a portion of a position measurement system.

8. The lithographic apparatus of claim 1, wherein the shield device comprises a plate shaped object, the plate shaped object being stiff.

9. The lithographic apparatus of claim 1, wherein the shield device is mounted on a portion of the base frame that is less sensitive to a disturbance such as the pressure wave than the element.

10. The lithographic apparatus of claim 1, wherein a portion of the shield device is mounted on the element with one or more flexible mounts.

11. The lithographic apparatus of claim 1, wherein the shield device is configured to function as shield to a magnetic or electrical field.

12. The lithographic apparatus of claim 1, wherein the shield device is configured to function as heat resistance, heat reflective or heat absorbent shield.

13. The lithographic apparatus of claim 1, wherein the moving object comprises the support or the substrate table.

14. The lithographic apparatus of claim 1, wherein the the moving object comprises the support or the substrate table.

15. A lithographic apparatus comprising:
    an illumination system configured to condition a radiation beam;
    a support constructed to support a patterning device, the patterning device capable of imparting the radiation beam with a pattern in its cross-section to form a patterned radiation beam;
    a substrate table constructed to hold a substrate;
    a projection system configured to project the patterned radiation beam onto a target portion of the substrate;
    a base frame with a metrology frame mounted thereon, the metrology frame configured to support the projection system; and
    a shield device arranged between the projection system and the support or the substrate table, wherein the shield device is arranged to substantially absorb or reflect a pressure wave induced by a moving object of the lithographic apparatus and the shield device comprises two or more adjacent plates separated by one or more gaps only with one of an air, a gas, or an acoustic damping material.

16. A method of shielding a lithographic apparatus element sensitive to a pressure wave in the environment of the element, the method comprising:
    supporting a projection system with a metrology frame, wherein the metrology frame is on a base frame; and
    providing a shield device between the element and a source of the pressure wave, wherein the source of the pressure wave comprises a moving object of the lithographic apparatus, and wherein the shield device is arranged to substantially absorb or reflect the pressure wave and the shield device comprises two or more adjacent plates separated by one or more gaps filled with one of an air, a gas, or an acoustic damping material.

17. A device manufacturing method comprising:
    coating a substrate with a radiation-sensitive material;

projecting a patterned beam of radiation onto the substrate using the lithographic apparatus of, the lithographic apparatus comprising:
- an illumination system configured to condition a radiation beam;
- a support constructed to support a pattern device, the patterning device capable of imparting the radiation beam with a pattern in the beam's cross-section to form a patterned radiation beam;
- a substrate table constructed to hold a substrate;
- a projection system configured to project the patterned radiation beam onto a target portion of the substrate;
- a base frame with a metrology frame mounted thereon, wherein the metrology frame is arranged to support the projection system; and
- a shield device arranged between a source of a pressure wave and an element of the lithographic apparatus sensitive to the pressure wave, wherein the source of the pressure wave comprises a moving object of the lithographic apparatus, and wherein the shield device is arranged to substantially absorb or reflect the pressure wave and the shield device comprises two or more adjacent plates separated by one or more gaps filled with one of an air, a gas, or an acoustic damping material;

developing the substrate; and
baking the substrate.

18. A device manufacturing method comprising:
supporting a projection system of a lithographic apparatus with a metrology frame, wherein the metrology frame is mounted on a base frame;
projecting a patterned beam of radiation onto a target portion of a substrate with the projection system; and
during the projecting, shielding, via a shield device arranged to substantially absorb or reflect a pressure wave induced by a moving part of the lithographic apparatus and comprising two or more adjacent plates separated by one or more gaps filled with one of an air, a gas, or an acoustic damping material, an element of the lithographic apparatus sensitive to the pressure wave.

19. The method of claim 18, wherein the element compromises a part of the projection system configured to project the patterned beam of radiation.

20. The lithographic apparatus of claim 1, wherein the shield device is flexibly supported to avoid generation of another pressure wave by the shield device.

21. The lithographic apparatus of claim 8, wherein the plate shaped object includes ribbing to absorb or reflect the pressure wave, 22. The lithographic apparatus of claim 1, wherein the shield device is arranged between the support and the projection system.

23. The lithographic apparatus of claim 22, wherein the shield device includes an inner shield plate tightly placed within an opening of an outer shield plate.

24. The lithographic apparatus of claim 23, wherein the inner shield plate is mounted on the projection system.

25. The lithographic apparatus of claim 24, wherein the inner shield plate is flexibly mounted on the projection system via spring elements between the inner shield plate and the projection system.

26. The lithographic apparatus of claim 22, further comprising:
an additional shield device arranged between the projection system and the substrate table, wherein the addition shield device lies along a plane parallel to the substrate table.

* * * * *

UNITED STATES PATENT AND TRADEMARK OFFICE
CERTIFICATE OF CORRECTION

| | | |
|---|---|---|
| PATENT NO. | : 7,969,550 B2 | Page 1 of 1 |
| APPLICATION NO. | : 11/785751 | |
| DATED | : June 28, 2011 | |
| INVENTOR(S) | : Geerke et al. | |

It is certified that error appears in the above-identified patent and that said Letters Patent is hereby corrected as shown below:

Col. 9 in claim 1, line 46, please delete "it's" and replace with "the beam's"
Col. 10 in claim 14, line 30, after "wherein the" please delete "the"
Col. 12 in claim 19, lines 8 and 9, please delete "compromises" and insert --comprises--
Col. 12 in claim 21, line 15, please delete "," and insert --.--
Col. 12 in claim 36, line 30, please delete "addition" and insert --additional--

Signed and Sealed this
Twenty-third Day of August, 2011

David J. Kappos
*Director of the United States Patent and Trademark Office*